United States Patent [19]

Nadir

[11] Patent Number: 4,659,996
[45] Date of Patent: Apr. 21, 1987

[54] METHOD AND APPARATUS FOR DE-RINGING A SWITCHED CAPACITOR FILTER

[75] Inventor: Mark Nadir, Ft. Lauderdale, Fla.

[73] Assignee: Motorola, Inc., Schaumburg, Ill.

[21] Appl. No.: 584,052

[22] Filed: Feb. 27, 1984

[51] Int. Cl.[4] .................. H03B 1/00; H03B 1/10; H03K 5/00

[52] U.S. Cl. .................. 328/167; 328/162; 307/520; 84/1.13

[58] Field of Search .............. 328/127, 137, 162, 167, 328/185; 307/520, 521, 263, 246; 330/107; 333/172, 173; 364/825; 84/1.13

[56] References Cited

U.S. PATENT DOCUMENTS

| | | | |
|---|---|---|---|
| 3,803,429 | 4/1974 | Wieczorek | 307/304 |
| 3,852,619 | 12/1974 | Carbrey | 328/167 |
| 4,179,665 | 12/1979 | Gregorian | 330/107 |
| 4,210,872 | 7/1980 | Gregorian | 330/107 |
| 4,296,392 | 10/1981 | Lee | 330/107 |
| 4,306,197 | 12/1981 | Gregorian | 330/107 |
| 4,329,599 | 5/1982 | Gregorian et al. | 330/107 |
| 4,331,894 | 5/1982 | Gregorian et al. | 330/107 |
| 4,331,944 | 5/1982 | Lee | 330/107 |
| 4,338,571 | 7/1982 | Young | 330/107 |
| 4,344,050 | 8/1982 | Callahan | 333/173 |
| 4,365,217 | 12/1982 | Berger et al. | 333/173 |
| 4,375,625 | 3/1983 | Lee | 330/107 |
| 4,377,759 | 3/1983 | Ohhata et al. | 307/520 |
| 4,378,538 | 3/1983 | Gignoux | 333/172 |
| 4,392,068 | 7/1983 | Welles, II | 307/520 |

OTHER PUBLICATIONS

Caves et al., "Sampled Analog Filtering Using Switched Cap. as Resistor Equivalents", IEEE Jor. of SSC, vol.-SC12, No. 6, 12/77.
Allstot et al., "Electrically-Programmable Switched Cap Filter", IEEE Jor. of SSC, vol. SC-14, No. 6, 12/79, pp. 1034-1044.
Viswanathan et al., "Increasing the Clock Frequency of Switched Capacitor Filters", Electronic Letters, vol. 16, No. 9, 4/80, pp. 316-317.
"MOS Sampled Data Recursive Filters Using Switched Capacitor Integrators", B. J. Hosticka, and R. W. Brodersen and P. R. Gray, IEEE Journal of Solid-State Circuits, vol. SC-12, No. 6, Dec. 1977.

Primary Examiner—Stanley D. Miller
Assistant Examiner—Timothy P. Callahan
Attorney, Agent, or Firm—Mark P. Kahler; Joseph T. Downey; Anthony J. Sarli, Jr.

[57] ABSTRACT

A switched capacitor filter system is provided which is programmed to filter a predetermined sequence of tone signals. The filter system is de-rung after each selected tone signal is detected by increasing the clock frequency of the switched capacitor from the programmed value corresponding to a tone signal up to a center frequency substantially greater than that of the tone signals. Energy stored in the filter system is thus quickly dissipated. Rapid sequences of sequential tone signals are thus filtered without the problems associated with ringing of the filter.

6 Claims, 7 Drawing Figures

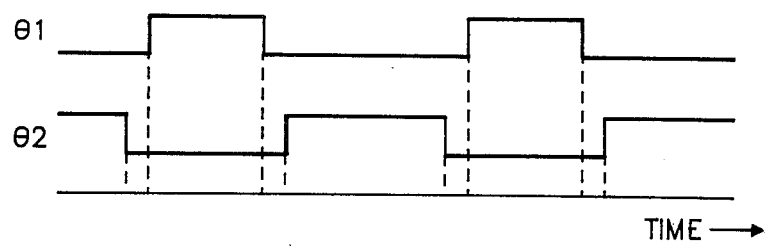
Fig. 2
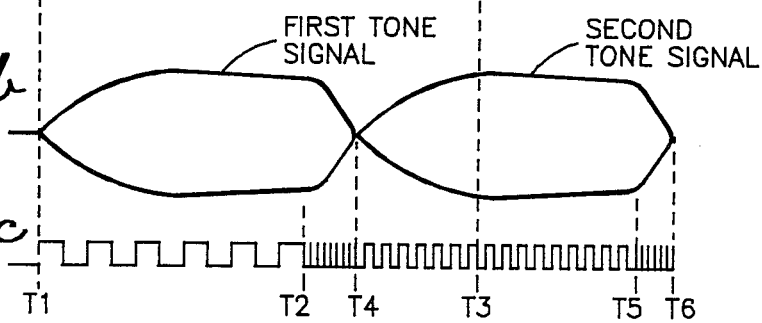
Fig. 3a
Fig. 3b
FIRST TONE SIGNAL
SECOND TONE SIGNAL
Fig. 3c
T1  T2 T4  T3  T5 T6
Fig. 4a
dB
1KHz
FREQUENCY (KHz) →
Fig. 4b
dB
38KHz
FREQUENCY (KHz) →

METHOD AND APPARATUS FOR DE-RINGING A SWITCHED CAPACITOR FILTER

BACKGROUND OF THE INVENTION

This invention relates to switched capacitor filters and, more particularly to switched capacitor filters employed in tone detectors.

DESCRIPTION OF THE PRIOR ART

Many conventional radio paging systems employ a transmitted sequence of audio tones to instruct a pager when to alert. In such radio paging system, a unique sequence of tones corresponds to each pager. The pager typically includes a tone detector having a plurality of filters, that is, one filter for each tone of the unique sequence corresponding to the pager. Each filter is coupled to a corresponding comparator which determines whether a particular tone has been provided to the filter coupled thereto. When the tone detector determines that all of the tones of the unique sequence corresponding to a particular pager have been received, the pager alerts. One typical signal tone exhibits a frequency of 1000 Hz, by way of example. Other signal tones exhibit frequencies within the audio range in some systems.

To obviate the need for employing a large number of different filters tuned to different tone frequencies in radio pagers, modern pagers employ programmable filters which exhibit different selected bandpass responses in response to appropriate instructions. The programmable filter replaces the plurality of filters described above and is coupled to a single comparator. One programmable filter which may be employed as the filter in a pager tone detector is a switched capacitor filter. For example, such filter is essentially an RC-type filter wherein the capacitor portion consists of at least one capacitor and the resistor portion consists of at least one switched capacitor resistance element whose resistance varies according to the frequency of the clock signal provided to the filter. By varying the clock signal frequency, the resistance of the switched capacitor is changed such that the center frequency of the switched capacitor filter is controlled.

The switched capacitor filter employed in a radio pager must be capable of quickly processing the aforementioned sequence of short duration tone signals which typically follow each other in rapid succession. Thus, after each sequential tone is received by the filter, the filter must assume equilibrium conditions before the next tone signal is processed. That is, the energy from a received tone signal which is stored in the switched capacitors of the filter must be dissipated before the next tone of the sequence can be processed by the filter. This can be accomplished by allowing sufficient time to pass after a tone signal is provided to the filter such that energy thus stored in the filter decays down to a nominal equilibrium value. Unfortunately, for such decay to occur, it would take so long that likely the next tone of the sequence would have already begun. In such instance, falsing or inaccurate tone signal detection is likely.

One approach which quickly returns the switched capacitors of the filter to equilibrium values prior to commencement of the next tone of a tone signal sequence is to employ a transmission gate at each switched capacitor to couple stored energy to ground after each tone is received and detected prior to commencement of the next tone signal. Unfortunately, such an approach may result in disturbance of the DC bias of the filter. The above described approaches for restoring equilibrium to the switched capacitor filter are referred to as de-ringing the filter in that these approaches diminish the undesired ringing effects which depend on the Q of the filter.

One object of the present invention is to provide a switched capacitor filter which is capable of rapid de-ringing such that DC equilibrium is restored after each tone signal is received and prior to the commencement of the next successive tone signal.

Another object of the present invention is to provide a switched capacitor filter which is capable of de-ringing without upset to the DC bias of the filter.

These and other objects of the invention will become apparent to those skilled in the art upon consideration of the following description of the invention.

BRIEF SUMMARY OF THE INVENTION

The present invention is directed to providing a switched capacitor filter capable of rapid de-ringing.

In accordance with one embodiment of the invention, a switched capacitor filter arrangement includes at least one capacitive element. The switched capacitor filter further includes at least one switched capcitor resistive element coupled to the capacitive element to form a filter. The cut off frequency of the filter depends on the rate at which the switched capacitor resistive element is clocked. The switched capacitor filter further includes a clock circuit coupled to the at least one switched capacitor. The clock circuit is operative in a first mode for clocking the switched capacitor resistive element at rates corresponding to selected frequencies and is further operative in a second mode for clocking the switched capacitor at a rate substantially greater than any rate of the first mode to rapidly discharge energy stored in the filter.

The features of the invention believed to be novel are set forth with particularity in the appended claims. The invention itself, however, both as to organization and method of operation, together with further objects and advantages thereof, may best be understood by reference to the following description taken in conjunction with the accompanying drawings.

DESCRIPTION OF THE DRAWINGS

FIG. 2 shows the timing diagrams of the two clock signals which control switching in the present invention.

FIG. 3A shows a representation of the envelope of a tone signal processed by a conventional switched capacitor filter.

FIG. 3B shows a representation of the envelope of a tone signal processed by the switched capacitor filter arrangement of the present invention.

FIG. 3C shows a representation of a clock signal for the switched capacitor filter of FIG. 1.

FIG. 4A is a graph of the frequency response of the switched capacitor filter of FIG. 1 when such filter is operating in a first mode.

FIG. 4B is a graph of the frequency response of the switched capacitor filter of FIG. 1 when such filter is operating in a second de-ringing mode.

DETAILED DESCRIPTION OF THE PREFERRED EMBODIMENT

Figure 1:
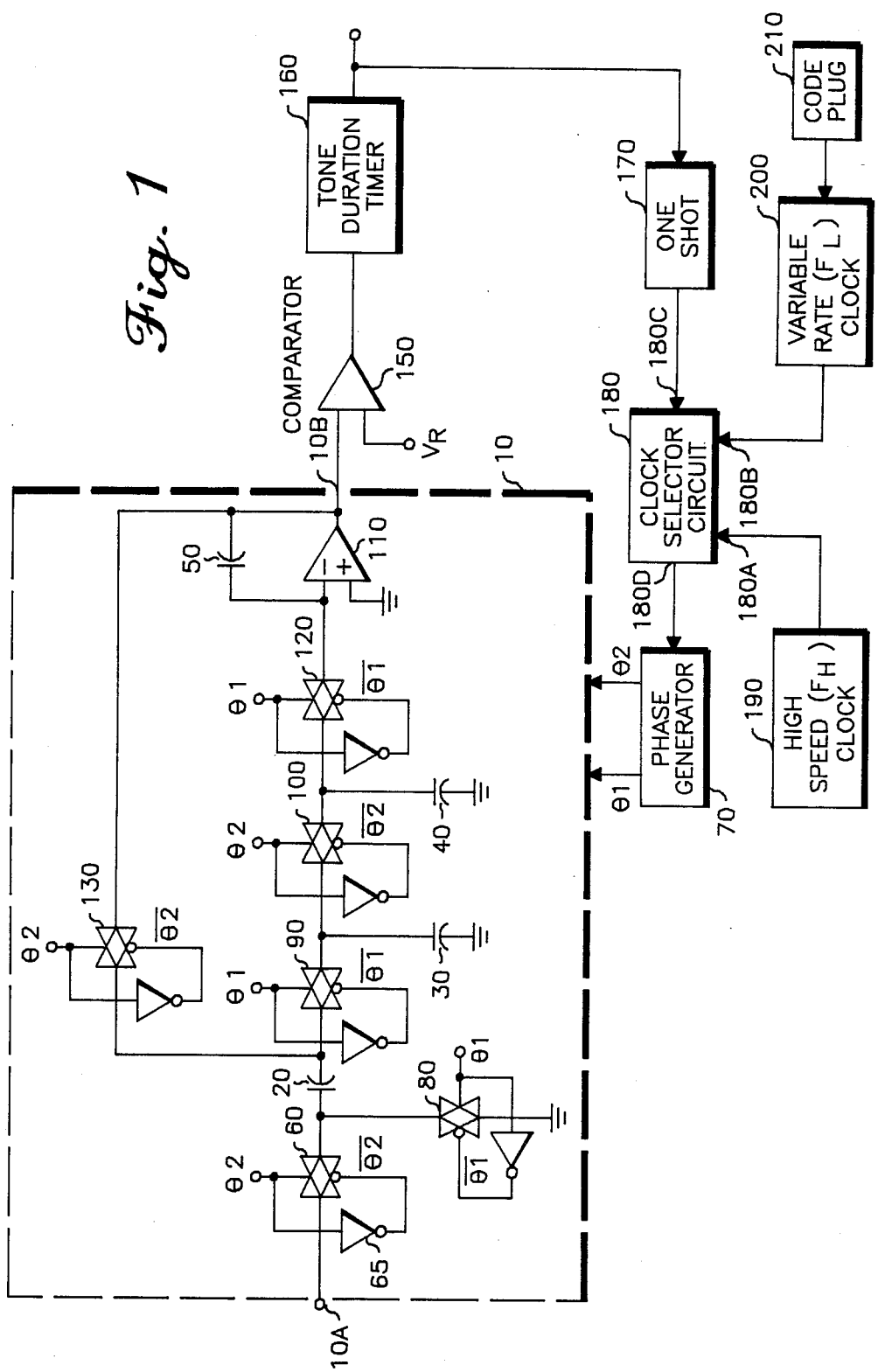
FIG. 1 is a block diagram-partial schematic of the switched capacitor filter of the present invention.

FIG. 1 shows the switched capacitor filter system of the present invention. The filter system of FIG. 1 includes a switched capacitor filter such as filter 10 shown in FIG. 1. Those skilled in the art will appreciate that other switched capacitor filters may be used in the FIG. 1 filter system in place of the particular switched capacitor filter topology shown as filter 10. However, for sake of completeness, the topology of a typical switched capacitor filter is discussed below. Information regarding the operation of a filter substantially similar to this switched capacitor filter is found in the article referenced hereafter.

As shown, filter 10 includes an input 10A and an output 10B. Switched capacitor filter 10 includes capacitors 20, 30, 40, and 50. One end of capacitor 20 is coupled to filter input 10A via a transmission gate 60 therebetween. The non-inverting control line of transmission gate 60 is coupled to the $\theta1$ output of a phase generator circuit 70. Phase generator circuit 70 generates phase clock signals $\theta1$ and $\theta2$ at the respective $\theta1$ and $\theta2$ outputs thereof. The timing relationship of the $\theta1$ and $\theta2$ phase clock signals is shown in FIG. 2 and will be discussed later in more detail. The non-inverting control line of transmission gate 60 is coupled to the inverting control line thereof via an inverter such that the inverse, $\overline{\theta2}$, is supplied to the inverting input. The times at which transmission gate 60 is turned on and off to permit periodic charging of capacitor 20 are thus controlled by the clock signals generated by phase generator circuit 70.

A transmission gate 80 is coupled between ground and the end of capacitor 20 which is coupled to transmission gate 60. The non-inverting input of transmission gate 80 is coupled to the $\theta1$ output of variable rate clock circuit 70 such that the $\theta1$ clock phase signal is provided thereto. The inverting input of transmission gate 80 is coupled to the non-inverting input of transmission gate 80 such that the inverse, $\overline{\theta1}$, of the $\theta1$ phase clock signal is supplied thereto. Thus, the $\theta1$ phase clock signal controls the times at which capacitor 20 is coupled to ground to discharge such capacitor.

The remaining end of capacitor 20 is coupled to capacitor 30 via a transmission gate 90 therebetween. The remaining end of capacitor 30 is coupled to a negative voltage supply as shown. The non-inverting control line of transmission gate 90 is coupled to the $\theta1$ output of phase generator circuit 70 such that the $\theta1$ output of phase generator circuit 70 such that the $\theta1$ phase clock signal is provided thereto. The inverting control line of transmission gate 90 is coupled by an inverter to the non-inverting control line of transmission gate 90 such that the inverse, $\overline{\theta1}$, is supplied to the inverting control line of transmission gate 90. In this manner, the $\theta1$ phase clock signal determines the times at which transmission gate 90 is opened and closed to control the times at which capacitor 20 is coupled to capacitor 30 to transfer charge from capacitor 20 to capacitor 30.

The end of capacitor 30 coupled to transmission gate 90 is coupled to capacitor 40 via a transmission gate 100 therebetween. The remaining end of capacitor 40 is coupled to a negative voltage supply as shown. The non-inverting control line of transmission gate 100 is coupled to the $\theta2$ phase clock signal output of phase generator circuit 70. The inverting control line of transmission gate 100 is coupled via an inverter to the non-inverting control line of transmission gate 100. In this manner, the inverse, $\overline{\theta2}$, of the $\theta2$ phase clock signal is provided to the inverting control line of transmission gate 100. The times at which capacitors 30 and 40 are coupled together to transfer charge therebetween is thus controlled by the $\theta2$ phase clock signal.

The end of capacitor 40 coupled to transmission gate 100 is coupled to the inverting input of an operational amplifier 110 via a transmission gate 120 therebetween. The non-inverting control line of transmission gate 120 is coupled to the $\theta1$ output of phase generator 70 such that the $\theta1$ clock signal is provided to the non-inverting control line of transmission gate 120. The inverting control line of transmission gate 120 is coupled via an inverter to the non-inverting control line of transmission gate 120. In this manner, the $\theta1$ phase clock signal controls the times at which capacitor 40 is coupled to the inverting input of operational amplifier 110 to supply charge thereto. The non-inverting input of operational amplifier 110 is coupled to ground.

As shown in FIG. 1, the inverting input of operational amplifier 110 is coupled via a capacitor 50 to the output of operational amplifier 110. A transmission gate 130 is coupled between the output of amplifier 110 and the end of capacitor 20 coupled to transmission gate 90. A controlled feedback path is thus provided between the inverting input of operational amplifier 110 and capacitor 20. The non-inverting control line of transmission gate 130 is coupled to the $\theta2$ phase clock output of phase generator circuit 70. The inverting control line of transmission gate 130 is coupled by a inverter to the non-inverting control line of transmission gate 130. The $\theta2$ phase clock signal thus controls the times at which transmission gate 130 is turned on and off to provide feedback between the output of operational amplifier 110 and capacitor 20.

The switched capacitor filter 10 of FIG. 1 is an example of just one typical switched capacitor filter which may be employed as programmable filter 10 of the present invention. A filter substantially similar to the switched capacitor filter discussed above is described in the article "MOS Sampled Data Recursive Filters Using Switched Capacitor Integrators", *IEEE Journal of Solid State Circuits*, Volume SC-12, No. 6, December 1977, pages 600–608. The entire article being incorporated herein by reference. FIG. 5 of this article and the accompanying discussion describe one such filter which may be employed as programmable filter 10.

In FIG. 1, 10A represents the input of filter 10 to which signals such as sequential tone signals may be applied for filtering and later detection. The output of operational amplifier 110 corresponds to filter output 10B at which a filter tone signal appears when a tone signal within the pass band of filter 10 is provided to filter input 10A.

Filter 10 exhibits a frequency response which depends on the clocking rate of the $\theta1$ and $\theta2$ phase clock signals supplied to the $\theta1$ and $\theta2$ inputs of filter 10. The $\theta1$ and $\theta2$ phase clock signals are non-overlapping substantially square wave clock signals generated by phase generator 70 and depicted in FIG. 2. Returning again to FIG. 1, the input of phase generator 70 is coupled to the output of a clock selector circuit 180 having inputs 180A, 180B, and 180C. Input 180A is coupled to the output of a high speed clock circuit 190 which generates square wave input clock signals designated $F_H$ at a frequency of approximately 266 kHz in one embodiment of the invention. Input 180B is coupled to the output of a variable rate clock circuit 200 which generates input clock signals $F_L$ exhibiting frequencies substantially lower than the frequency of the high speed input clock signal $F_H$. The exact frequencies at which programmable (variable rate) clock circuit 200 generates $F_L$ clock signals are programmed into code plug memory 210 coupled thereto.

For purposes of example, it is assumed that the filter system of FIG. 1 is to process and detect the presence of a sequence of 5 tone signals exhibiting frequencies of 1000, 2000, 3000, 4000 and 5000 Hz, respectively. To detect these tone signals, filter 10 is sequentially programmed to filter the next tone of the sequence after each successive tone is detected. That is, initially, filter 10 is programmed to exhibit a center frequency $f_c$ of 1000 Hz. After a first tone signal at 1000 Hz is received, filter 10 is then reprogrammed to exhibit a center frequency, $f_c$, of 2000 Hz corresponding to the second tone signal, and so forth through the fifth tone signal.

This is accomplished by having variable rate clock circuit 200 initially read information from code plug 110 to instruct clock circuit 200 to generate clock signals $F_L$ which will drive the center frequency $f_c$ of filter 10 to 1000 Hz. That is, to drive the center frequency $f_c$ to 1000 Hz in preparation for the first tone, the frequency of rate of the $\theta 1$ and $\theta 2$ clock signals is approximately seven (7) times the frequency of the 1000 Hz first tone or 7000 Hz. Thus, code plug 210 contains information which causes variable rate clock circuit 100 to generate low frequency $F_L$ input clock signals having a frequency of 7000 Hz, as well as information regarding the frequency of the $F_L$ input clock signals necessary to cause filter 10 to filter the remaining 4 tones of the 5 tone sequence.

While a particular tone signal is being filtered by filter 10 and detected, clock selector circuit 100 is operative in a first mode to provide the low speed $F_L$ input clock signal from variable rate clock 200 to phase generator 70. However, after a tone signal is detected by the cooperative action of a comparator 150, a tone duration timer 160 and a one shot circuit 170 in a manner subsequently described in detail, clock selector circuit 80 switches to a second mode wherein the high speed input clock signal $F_H$ (266 kHz) from clock 190 is provided to phase generator 70. The high speed $\theta 1$ and $\theta 2$ clock signals thus produced by phase generator 70 cause the center frequency $f_c$ of filter 10 to be momentarily raised to 38 kHz such that residual energy stored in the capacitive elements of filter 10 is rapidly dissipated. This advantageously prevents filter 10 from ringing and helps prepare filter 10 for the next tone of the sequence. Immediately after de-ringing filter 10 as described above, clock selector circuit 180 switches back to the first mode, such that code plug 210 provides information to clock 200 to cause clock 200 to generate $F_L$ input clock signals corresponding to the frequency of the second tone signal to be processed. Upon returning to the first mode of operation, clock selector circuit 180 provides the $F_L$ input clock signals corresponding to the second tone to phase generator 70 which generates the appropriate $\theta 1$ and $\theta 2$ phase clock signals to drive the center frequency $f_c$ of filter 10 to the frequency of the second tone signal of the desired tone signal sequence. After the second tone signal is processed, second mode operation is again momentarily commenced to cause de-ringing of filter 10 in preparation for processing the third tone signal of the sequence. Alternate first mode and second mode operation continues in this manner until all 5 tone signals of the sequence have been processed.

The following is a discussion of the filter system of the present invention more detailed that the introductory discussion given above.

Filter 10 exhibits a frequency response which depends on the clocking rate of the $\theta 1$ and $\theta 2$ clock signals generated by phase generator 70. The values of the components of filter 10 are selected according to known design techniques to exhibit a low-pass type frequency response such as that shown in FIG. 4A. That is, in the example of FIG. 4A, the components of filter 10 are selected to exhibit a low pass, underdamped response with a peak in the response occurring at approximately 1 kHz which is designated the center frequency $f_c$ of the filter. The center frequency of the filter is proportional to the frequency of the $\theta 1$ and $\theta 2$ phase clock signals. As mentioned above, the clock freuqency of variable rate clock 200 is approximately equal to 7 times the center frequency exhibited by programmable filter 10 for each tone signal to be filtered. By appropriately selecting the clock frequency $F_L$ of variable rate clock 100, the center frequency $f_c$ of filter 10 is correspondingly programmably varied.

Assume, for example, that it is desired for the filter system of FIG. 1 to receive a sequence of five tone signals and to determine whether such five tone signals exhibit the same respective five frequencies as five frequencies stored in a code plug memory 210. In this instance, code plug 210 (a read only memory, for example) supplies variable rate clock circuit 200 initially with information regarding the first frequency which filter 10 is to be programmed to filter. For example, if the filter 10 is to respond to first, second, third, fourth, and fifth tone signals exhibiting frequencies of 1000 Hz, 2000 Hz, 3000 Hz, 4000 Hz, and 5000 Hz, respectively, then programmable filter 10 is first instructed to exhibt a center frequency equal to the aforementioned tone frequencies. That is, for a first tone exhibiting a frequency of 1000 Hz, code plug 210 includes information which instructs variable rate clock 200 to generate $F_L$ input clock signals exhibiting the frequency of $7 \times 1000$ Hz, namely 7 kHz. At this point in time, no input signal is present at input 180C of clock selector circuit 180 and thus circuit 180 is operative in a first mode wherein output 180D is coupled to input 180B. It is noted that clock selector circuit 100 operates in a first mode to provide low speed $F_L$ clock signals at input 180B to output 180D and phase generator 70 coupled thereto when no input signal is provided to input 180C. However, when an appropriate input signal is provided to input 180C, clock circuit 190 commences operation in a second mode wherein high speed $F_H$ clock signals at input 180A from high speed clock 90 are provided to output 180D and phase generator 70 coupled thereto.

With clock rate thus set in the first mode, phase generator 70 generates $\theta 1$ and $\theta 2$ phase clock signals as shown in FIG. 2 to cause programmable filter 10 to exhibit a bandpass-type response with a center frequency $f_c$ equal to 1 kHz similar to the shape of the response of FIG. 4A. Thus, when programmable filter 10 is programmed as described above to exhibit a center frequency equal to 1000 Hz and an audio tone signal exhibiting a frequency equal to 1000 Hz is applied to input 10A, filter 10 passes such tone signal through to its output 10B and attenuates signals exhibiting frequencies other than 1000 Hz. One input of a two input comparator 150 is coupled to filter output 10B with the remaining comparator input being coupled to a voltage reference $V_r$ exhibiting an appropriate voltage value such that when a filtered tone signal such as the first 1000 Hz tone is applied to the comparator input coupled to 10B, comparator 150 generates an output signal. The output of comparator 150 is coupled to the input of a tone duration timer 160 which generates a signal at its output when a signal is provided at its input for a predetermined amount of time, for example 50 milliseconds. Thus, when the appropriate first tone, namely a 1000 Hz first tone, is provided to input 10A and appears at filter output 10B for more than 50 milliseconds such that the output of comparator 150 generates a periodic output signal for more than 50 milliseconds, then tone duration timer 160 generates a signal at its output which indicates that a 1000 Hz tone, namely the first tone, has been detected by the filter system of FIG. 1.

Once the appropriate first tone signal has been detected, the switched capacitor filter 10 must be prepared to receive the second tone signal, namely a 2000 Hz tone signal. If the apparatus and method of the invention were not employed, the first tone signal received by filter 10 would appear at filter output 10B and exhibit a tone envelope such as that shown in FIG. 3A. Time T1 in FIG. 3A corresponds to the time the first tone signal begins to appear at filter output 10B. Time T2 corresponds to the time at which the presence of the first tone signal is detected as indicated by the generation of an output signal tone duration timer 160. After time T2, without the technique of the invention, the first tone signal at the output of the switched capacitor filter slowly decays in amplitude until it is no longer present as indicated at time T3 of FIG. 3A. It is thus seen that the first tone signal would take a relatively long amount of time, namely the time between time T2 and time T3 to decay to a zero amplitude after such first tone signal is detected, but for the action of the present invention. That is, without the circuit and method of the invention, the relatively long amount of time between time T2 and time T3 is wasted waiting for the first tone signal to decay to a zero amplitude before the second tone signal may commence. If the second tone signal were to commence while filter 10 was still ringing with the first, then it is likely that signal falsing would result.

To stop switched capacitor filter 10 from ringing with the first tone signal after tone detection at time T2, once the first tone is detected (at time T2), variable rate clock circuit 200 is caused to generate $F_H$ clock signals at a frequency substantially greater than the frequency $F_L$ input clock signals. That is, in the case of the first 1000 Hz tone signal, for which the frequency of the $F_L$ input clock signal and the $\theta 1$ and $\theta 2$ phase clock signals derived therefrom where set to approximately 7 kHz by code plug 210, the frequency of the $\theta 1$ and $\theta 2$ phase clock signals is increased to approximately 266 kHz by causing clock selector circuit 180 to switch from mode 1 to mode 2 operation so as to provide high speed $F_H$ input clock signals (266 kHz) from high speed clock 190 to phase generator 70. A high speed clock signal $F_H$ frequency of 266 kHz and the like 266 kHz frequency of the resultant $\theta 1$ and $\theta 2$ phase clock signals correspond to a filter center frequency of approximately 38 kHz.

To accomplish this momentary substantial increase of filter center frequency, the output of tone duration timer 160 is coupled to the input of a one shot circuit 170. When tone duration timer 160 generates an output signal indicating that the first tone or a subsequent tone is detected, one shot circuit 170 generates an output signal for approximately one millisecond which instructs a clock rate selector circuit 180 coupled thereto to switch from mode 1 (input 180B coupled to output 180D) to mode 2 (input 180A coupled to output 180D) such that the high speed $F_H$ clock signal is provided from high speed clock 190 to phase generator 70. Since high speed $F_H$ clock signals are now provided to phase generator 70, phase generator 70 commences generating $\theta 1$ and $\theta 2$ phase clock signals (see FIG. 2) exhibiting the same frequency as the $F_H$ input clock signal, namely 266 kHz. This momentary increase of the $\theta 1$ and $\theta 2$ phase clock frequency and the filter center frequency causes energy stored in the filter, that is in the capacitors thereof, to be rapidly dissipated. As shown in FIG. 3B, detection of tone 1 occurs at time T2 upon which the clock rate dramatically increases causing the envelope to decay very rapidly to zero at time T4 as shown in the drawing. After the one millisecond output signal from one shot circuit 170 has ceased, clock rate selector circuit switches from mode 2 operation (input 180A coupled to output 180D) back to mode 1 operation (input 180B coupled to output 180D). Code plug 210 now instructs variable rate clock circuit 200 to generate $F_L$ input clock signals exhibiting a frequency appropriate to cause the center frequency $f_c$ of filter 10 to shift to the frequency of the second tone signal as discussed in more detail subsequently.

Since the present invention causes the envelope of the first tone signal to decay rapidly to zero after detection at time T2, the second tone signal and subsequent tone signals may now follow the first tone in rapid succession and be appropriately detected.

For purposes of example, it is assumed that the second tone of the 5-tone frequency sequence programmed into code plug 210 exhibits a frequency of 2000 Hz. Thus, the variable rate clock circuit 200 which was initially instructed by the code plug 210 to generate $F_L$ input clock signals at a frequency of 7 kHz (filter center frequency equals 1000 Hz) during mode 1 is now back in mode 1 subsequent to mode 2 de-ringing, and is now instructed by code plug 210 to generate $F_L$ clock signals exhibiting a frequency of approximately 14 kHz to shift the center frequency of filter 10 from 38 kHz (mode 2 de-ringing) to 2 kHz (mode 1) thus enabling processing of the second tone signal. When the second tone signal is detected, tone duration timer 160 generates an output signal which triggers one shot circuit 170 to cause clock rate selector circuit 180 to switch from mode 1 to mode 2 operation thus providing the high speed $F_H$ input clock signal from high speed clock circuit 190 to phase generator 70. In this manner, there is a momentary substantial increase in the frequency of the $\theta 1$ and $\theta 2$ phase clock signals to approximately 266 kHz for de-ringing purposes. Filter 10 ringing is thus suppressed in anticipation of the arrival of the third tone signal.

After de-ringing the second tone signal (mode 2), clock rate selector circuit 180 returns to mode 1 operation wherein variable rate clock circuit 200 is coupled to phase generator 70 via clock selector circuit 180. In preparation for processing the third tone signal, exhibiting a frequency of 3000 Hz by way of example, variable rate clock circuit 200 commences generating $F_L$ clock signals exhibiting a frequency of 21 kHz and phase generator 70 likewise generates phase clock signals $\theta 1$ and $\theta 2$ exhibiting a frequency of 21 kHz (corresponding to a filter center frequency of 3 kHz to match the third tone signal) as instructed by the programmed tone frequency information contained in code plug 210. When the third tone signal is detected, the filtering system of FIG. 1 commences de-ringing action in a manner similar to that described above for the first and second tone signals.

After de-ringing the third tone signal (mode 2), clock rate selector circuit 180 returns to mode 1 operation such that fourth tone frequency information is read from code plug 210 into variable rate clock circuit 200. Clock circuit 200 generates $F_L$ clock signals exhibiting a frequency of 28 kHz and provides such clock signals to phase generator 70 via clock selector circuit 180. Phase generator 70 in turn generates $\theta 1$ and $\theta 2$ phase clock signals exhibiting a frequency of 28 kHz which causes the center frequency of filter 10 to shift to 4 kHz, the frequency of the fourth tone. When the fourth tone is detected, clock rate selector circuit 180 switches to mode 2 such that the frequency of the $\theta 1$ and $\theta 2$ phase clock signals provided to filter 10 is substantially increased compared to the $F_L$ frequency. This causes the fourth tone signal to be derung. The same sequence of events, namely low phase clock signal speed while the tone signal is being filtered followed by fast phase clock signal speed for de-ringing the filter system is employed to process a fifth tone signal. Those skilled in the art will appreciate that the filtering system of the present invention may be employed to de-ring virtually any number of sequential or non-sequential tone signals whether such tone signals are a sequence of one tone, five tones, as in the present example, or virtually any number of tone signals.

FIG. 2 shows the wave form of the $\theta 1$ and $\theta 2$ phase clock pulses generated by phase generator circuit 70. The $\theta 1$ and $\theta 2$ phase clock signals are substantially square wave signals which are substantially 180° out of phase with respect to each other. It is noted that the $\theta 1$ and $\theta 2$ phase clock signals depicted in FIG. 2 exhibit a somewhat distored square wave pattern in that the highs or logical ones of the $\theta 1$ phase clock signal occur within the lows or logical zeros of the $\theta 2$ phase $\theta 2$ phase clock signal, and in that the logical highs or ones of the $\theta 2$ phase clock signal occur within the logical lows or ones of the $\theta 1$ phase clock signal. That is, the $\theta 1$ and $\theta 2$ phase clock signals do not overlap. It is thus assured that no two adjacent transmission gates of switched capacitor filter 10 of FIG. 1 are turned on at the same time. This is an operational requirement of the particular topology selected for switched capacitor filter 10, Of course, other filters may be employed where such non-overlapping clock signals are not required.

The above description sets forth a method for de-ringing a switched capacitor filter including at least one capacitive element coupled to at least one switched capacitor resistive element. The method is summarized in the following steps. The switched capacitor resistive element is clocked at a first predetermined frequency. The frequency at which the switched capacitor resistive element is clocked is substantially increased to a second predetermined frequency. Energy stored in the filter is thus rapidly dissipated resulting in desirable de-ringing.

The foregoing describes a filtering system capable of providing de-ringing for each of a plurality of sequential tone signals. Ringing of the programmable filter is thus prevented such that a rapid sequence of different frequency tone signals may be filtered.

While only certain preferred features of the invention have been shown by way of illustration, many modifications and changes will occur to those skilled in the art. It is, therefore, to be understood that the present claims are intended to cover all such modifications and changes as fall within the true spririt of the invention.

What is claimed is:

1. A method for de-ringing a switched capacitor filter including at least one capacitive element coupled to at least one switched capacitor resistive element comprising the steps of:

clocking said at least one switched capacitor resistive element at a first predetermined clocking frequency, and substantially increasing the frequency at which said at least one switched capacitor resistive element is clocked to a second predetermined clocking frequency such that energy stored in said filter is rapidly dissipated.

2. A filter arrangement comprising:

a switched capacitor filter including an input, an output, and a switched capacitor resistive element, the frequency to which said switched capacitor filter is tuned being dependent on the frequency at which said switched capacitor resistive element is clocked;

clock means, coupled to said switched capacitor resistive element, operative in a first mode for clocking said switched capacitor resistive element at one of a plurality of predetermined first frequencies resulting in said switched capacitor filter being tuned to one of a plurality of corresponding second predetermined frequencies, and operative in a second mode for clocking said switched capacitor resistive element at a frequency substantially greater than any of the plurality of first frequencies of said first mode such that energy stored in said filter is rapidly dissipated.

3. The filter arrangement of claim 2 including means for providing a tone signal to the input of said switched capacitor filter, and control means, coupled to said clock means, for instructing said clock means to switch from said first mode to said second mode after said tone signal is processed by said switched capacitor filter.

4. A filter arrangement comprising:

a switched capacitor filter including an input, an output, and a switched capacitor resistive element, the frequency to which said switched capacitor filter is tuned being dependent on the frequency at which said switched capacitor resistive element is clocked:

clock means, coupled to said switched capacitor resistive element, operative in a first mode for a first predetermined period of time for clocking said switched capacitor resistive element at one of a plurality of predetermined first frequencies resulting in said switched capacitor filter being tuned to one of a plurality of corresponding second predetermined frequencies, and operative in a second mode for a second predetermined period of time for clocking said switched capacitor resistive element at a frequency substantially greater than any of the plurality of first frequencies of said first mode such that energy stored in said filter is rapidly dissipated, said clock means returning to said first mode after said second predetermined period of time.

5. The filter arrangement of claim 4 including means for providing a tone signal to the input of said switched capacitor filter, and control means, coupled to said clock means, for instructing said clock means to switch from said first mode to said second mode after said tone signal is processed by said switched capacitor filter.

6. A method of de-ringing a switched capacitor filter including at least one capacitive element coupled to at least one switched capacitor resistive element comprising the steps of:

clocking said at least one switched capacitor resistive element at one of a plurality of first predetermined clocking frequencies;

substantially increasing the frequency at which said at least one switched capacitor resistive element is clocked to a second predetermined clocking frequency such that energy stored in said filter is rapidly dissipated, and returning to clocking said at least one switched capacitor resistive element at one of said plurality of first predetermined frequencies.

* * * * *